United States Patent
Miyakoshi

(10) Patent No.: US 8,076,188 B2
(45) Date of Patent: Dec. 13, 2011

(54) METHOD OF MANUFACTURING A SEMICONDUCTOR DEVICE

(75) Inventor: Kaoru Miyakoshi, Fujimino (JP)

(73) Assignee: New Japan Radio Co., Ltd., Tokyo (JP)

( * ) Notice: Subject to any disclaimer, the term of this patent is extended or adjusted under 35 U.S.C. 154(b) by 113 days.

(21) Appl. No.: 12/568,466

(22) Filed: Sep. 28, 2009

(65) Prior Publication Data

US 2011/0076811 A1    Mar. 31, 2011

(51) Int. Cl.
*H01L 21/338* (2006.01)
(52) U.S. Cl. ......................................... 438/172; 438/170
(58) Field of Classification Search .................. 438/172, 438/169, 170
See application file for complete search history.

(56) References Cited

U.S. PATENT DOCUMENTS

| | | | | |
|---|---|---|---|---|
| 5,051,372 A | * | 9/1991 | Sasaki | 438/59 |
| 5,166,083 A | * | 11/1992 | Bayraktaroglu | 438/170 |
| 5,213,987 A | * | 5/1993 | Bayraktaroglu | 438/314 |
| 6,465,804 B1 | * | 10/2002 | Shamir et al. | 257/25 |
| 7,001,820 B1 | * | 2/2006 | Miyajima et al. | 438/312 |
| 7,679,870 B2 | * | 3/2010 | Lin et al. | 361/56 |
| 7,847,410 B2 | * | 12/2010 | Lee et al. | 257/776 |
| 7,892,902 B1 | * | 2/2011 | Hudait et al. | 438/172 |
| 2008/0230806 A1 | * | 9/2008 | Pan et al. | 257/195 |

* cited by examiner

*Primary Examiner* — Wael Fahmy
*Assistant Examiner* — Grant Withers
(74) *Attorney, Agent, or Firm* — Rahman LLC

(57) ABSTRACT

A manufacturing method of a semiconductor device including a protecting element with a p-n junction which can be formed in the same process as that of a p-channel junction FET while the junction FET is formed in simple manufacturing process is provided. In the method of manufacturing semiconductor device composed of compound semiconductor having a p-channel FET and protective element, an n-type channel layer 2, $n^+$-type contact layer 3, n-type semiconductor layer 5, p-type channel layer 7, $p^+$-type contact layer 8 are laminated on a substrate 1 to form a semiconductor laminate portion 10. A portion of the semiconductor laminate portion 10 is removed by etching to expose the $n^+$-type contact layer 3 and gate electrode 13 of a junction p-channel FET 22 is formed on the surface of the exposed $n^+$-type contact layer 3. A protective element 23 is formed by a portion of the semiconductor 10.

4 Claims, 4 Drawing Sheets

METHOD OF MANUFACTURING A SEMICONDUCTOR DEVICE

BACKGROUND

The present invention relates to a method of manufacturing a semiconductor device composed of a p-channel transistor and protecting element by using a compound semiconductor of such as GaAs. More particularly, the present invention relates to a method of manufacturing a semiconductor device by which a p-channel transistor has a configuration of a junction transistor formed with a simple manufacturing process and a protecting element can be made in the fabricated manufacturing process as that of the p-channel transistor.

SUMMARY

To lower electric usage of an integrated circuit, a CMOS (complementary circuit) has been used in an integrated circuit using Si. In a microwave device, on the other hand, a compound semiconductor of such as GaAs has been used in place of Si since such semiconductor is excellent for use in high frequencies and high speed use due to high mobility of electrons. Integrated circuits using such compound semiconductor have been put in practical use and the use of a complementary transistor in a circuit using a compound semiconductor has been considered in view of lower electric usage. For this purpose, a p-channel transistor with holes that are typically inferior in movability to electrons is also required.

As for such transistor (hereinafter also referred to as FET), an MESFET using a junction FET or heterojunction as shown in FIG. 4(a) and FIG. 4(b) has been used, for example. The use of such transistor is feasible for increasing an operating voltage range by forward voltage Vf with high gate voltage, since such transistor performs enhanced operation in view of lower electric usage.

For example, as shown by an example in FIG. 4(a), the p-channel junction FET is formed by steps of selectively epitaxially growing a $n^+$-type semiconductor layer 54 consisting of GaAs on a channel region of a p-type channel layer 52 consisting of GaAs, providing $p^+$-type conductor layers 53 consisting of GaAs on the both sides of the $n^+$-type semiconductor layer 54 on the p-type channel layer 52, and providing a pair of source/drain electrodes 55 on the both sides of the $p^+$-type conductor layers 53 and a gate electrode 56 on the $n^+$-type semiconductor layer 54 in such a manner that the both electrodes form an ohmic contact. The element as represented by reference numeral 51 is a semi-insulating substrate composed of GaAs, for example.

The configuration shown in FIG. 4(b) is different from that in FIG. 4(a) in that an $n^+$-type diffusion region 58 is formed by selectively diffusing n-type impurities on the surface of the p-type channel layer 52 without selectively growing the $n^+$-type semiconductor layer 54. Other configurations are the same as that in FIG. 4(a) and their explanations are omitted by placing identical reference numerals. The FET shown in FIG. 4(b) has the same characteristics as that of FIG. 4(a).

As described above, to form a junction FET, it is required to selectively epitaxially grow the $n^+$-type semiconductor layer 54 or selectively diffusing the $n^+$-type diffusion region 58 on the p-type channel layer 52 to form a p-n junction between the gate electrode and channel layer. In particular for the case of a composition semiconductor of such as GaAs, the temperature of epitaxy is approximately 600° C. and the temperature of selective growth or selective diffusion needs to be lower than that of the growth temperature. If not the case, there is a problem that characteristics degrade by the variability in impurity concentrations or the thickness of an impurity layer of a semiconductor layer such as a channel layer to which epitaxy has already performed. Thus selective growth and diffusion need to be performed at a lower temperature and highly advanced technique is required. In view of mass production, there are problems that the production process is costly due to the production complexity and yield decreases due to the lack of reproductivity and stability.

Furthermore, although it is possible to perform enhanced operation in MESFETs, in a composition semiconductor of such as GaAs, there is no electrode material available for performing a Schottky junction with high barrier height (potential barrier). Thus there is a problem that an operating voltage range cannot be increased by forward voltage Vf with high gate voltage. Moreover, since a p-channel FET needs to be protected from ESD (electrostatic) stress, a protecting element needs to be included. Such protecting element is desirably fabricated without increasing manufacturing processes as much as possible.

The present invention is provided in view of the above-mentioned problems. The present invention provides a method of manufacturing a semiconductor device including a p-channel FET and a protecting element by which a junction FET is manufactured in a simple manufacturing process and the protecting element can be made in the same manufacturing process as that of the junction FET.

A method of manufacturing a semiconductor device according to the present invention comprises steps of forming a semiconductor laminate portion by successively growing a p-type channel layer for a p-channel transistor and a p-type contact layer over an n-type contact layer provided on a substrate, exposing the n-type contact layer by etching the semiconductor laminate portion in a region of a semiconductor circuit element while leaving the semiconductor laminate portion in a region where the p-channel transistor is formed and in a region where the protecting element is formed, exposing the n-type contact layer by etching the semiconductor laminate portion in a portion of the p-channel transistor region, and exposing the n-type contact layer by etching a portion of the semiconductor laminate portion in a portion of the protecting element region so as to form an electrode or etching the semiconductor laminate portion so as to form two p-n junctions which are coupled by the n-type contact layer, forming a gate electrode in a region where the p-channel transistor is formed so as to form an ohmic contact with a surface of the n-type contact layer which is exposed by the etching, and forming a source/drain electrode on the p-type contact layer remaining on both sides in the channel region of the p-channel transistor region and forming at least one electrode for the protecting element on a surface of the p-type contact layer.

By providing an etch stop layer between the p-type channel layer and the p-type contact layer, only the p-type contact layer is formed on the p-type channel layer without damaging the channel region of the p-type channel layer while keeping a uniform thickness thereof.

According to the present invention, a p-type channel layer for a p-channel FET and a p-type contact layer are laminated on an n-type semiconductor layer, and an n-type semiconductor layer, which is located below the channel layer, is used as a conductive layer which is different from the channel layer for forming a p-n junction between a gate electrode and channel layer of the junction FET. Thus, a junction FET can be formed, without performing selective epitaxy or selective diffusion, by forming a gate electrode on the surface of an n-type semiconductor layer which is exposed by etching. A protecting element is formed by the p-n junction of the semiconductor laminating portion which is laminated on the n-type semiconductor layer. Therefore, a protecting element with a p-n junction can be formed only by performing patterning in regions which is different from the junction FET in the semiconductor laminated configuration with the same junction FET. As a result, in the case of forming a circuit element of such as an n-channel FET for forming a complementary circuit, such element can be formed in a layer which is located below the n-type semiconductor layer by forming an n-channel layer below the n-type semiconductor layer, for example. Therefore, a p-channel FET for a complementary FET and protecting element can be formed in a highly simple manufacturing process.

DETAILED DESCRIPTION

Figure 1:
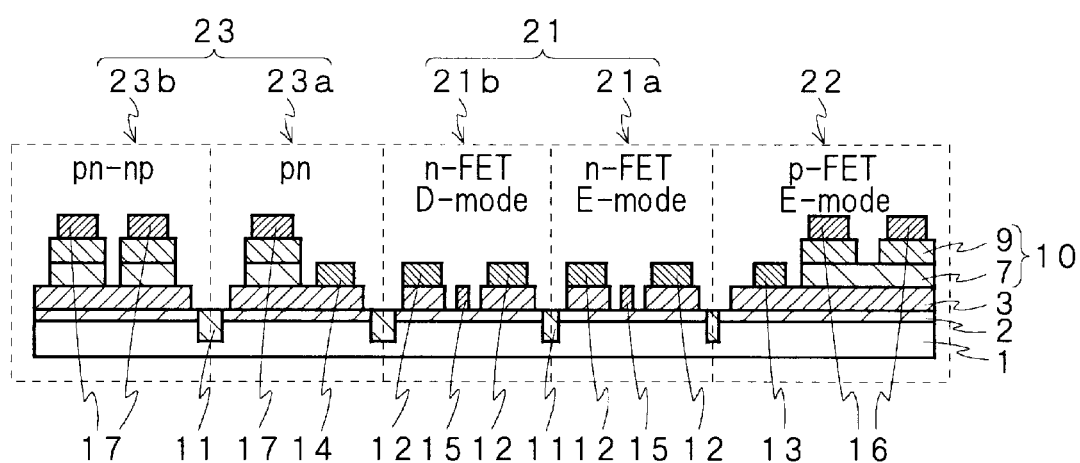
FIG. 1 is a sectional explanation view showing an example of the semiconductor device obtained according to the manufacturing method of the present invention.

A method of manufacturing a semiconductor device according to the present invention is described by referring to the drawings. The manufacturing method of a semiconductor device according to the present invention is a manufacturing method of a semiconductor device comprising a compound semiconductor and having a p-channel FET 22 and protecting element 23 thereof. FIG. 1 shows a sectional configuration showing a part of the p-channel FET 22, n-channel FET 21 and protecting element 23 of a semiconductor device manufactured according to one Embodiment. FIG. 2(a) to FIG. 2(e) show sectional explanation views showing exemplified manufacturing steps in which an undoped layer 6 and first and second etch stop layers 4, 8 are provided in addition to the configuration of FIG. 1. According to the examples shown in FIG. 1 and FIG. 2(a) to FIG. 2(e), not only that the p-channel FET 22 and protecting element 23 are shown, but the n-channel FET 21 is represented by an enhancement type FET 21a and a depletion type FET 21b, and the protecting element 23 is represented by a protecting element 23a with a typical p-n junction and a pn-np bidirectional protecting element 23b. However, both the enhancement type FET 21a and depletion type FET 21b are not required for the n-channel FET 21, and the n-channel FET 21 may not be provided. Furthermore, both protecting elements are not required for the protecting element 23. The example shows that protecting element 23 with either configuration can be fabricated in the same manufacturing process as that of the p-channel FET 22. In the following, the manufacturing method according to the present invention is described by way of an example shown in FIG. 2(a) to FIG. 2(e) in accordance with the steps in FIG. 2(a) to FIG. 2(e).

Figure 2A:
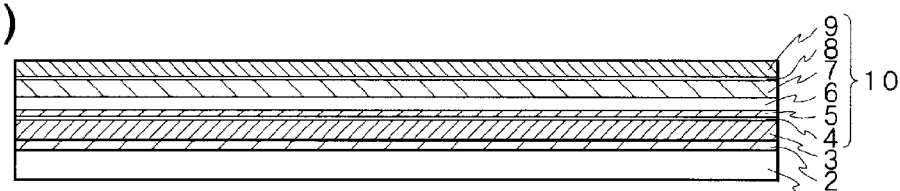
FIG. 2(a) is a sectional explanation view of steps showing one Embodiment according to the manufacturing method of the present invention.

As shown in FIG. 2(a), an n-type channel layer 2 for the n-channel FET 21 and n$^+$-type contact layer 3 (In this example, it is represented as n$^+$-type since an impurity concentration is relatively high, however, its conductivity is an n-type. The same applies to the p-type.) are epitaxially grown on a substrate 1. Then, a first etch stop layer 4, n$^+$-type semiconductor layer 5, undoped layer 6, p-type channel layer 7 for the p-channel FET 22, second etch stop layer 8, and p$^+$-type contact layer 9 are laminated on the n$^+$-type contact layer 3. The laminated portion above the first etch stop layer 4 is referred to as a semiconductor laminate portion 10 for the sake of convenience. In the example shown by FIG. 2(a) to FIG. 2(e), the first and second etch stop layers 4, 8, n$^+$-type semiconductor layer 5 and undoped layer 6 are provided as mentioned above. As a basic configuration, however, it is feasible if the semiconductor laminate portion 10 comprising the p-type channel layer 7 for the p-channel transistor 22 and p$^+$-type contact layer 9 is formed on the n$^+$-type contact layer 3 as shown in FIG. 1.

The substrate 1 is formed by using such as a semi-insulating GaAs substrate. Each of semiconductor layers of the semiconductor laminate portion 10 is also formed by using a compound semiconductor of such as GaAs so as to form a circuit element having large electron mobility and a high characteristic relative to microwave. In this case, the first and second etch stop layers 4, 8 are provided for providing different etching rates from that of the semiconductor layer consisting of GaAs, and may be formed to have a thickness of 3 to 10 nm by using AlGaAs compound, AlAs or InGaP compound.

The n$^+$-type contact layer 3 is provided for forming an ohmic contact with electrode metal and is provided for forming a p-n junction of the junction FET in the case the n$^+$-type semiconductor layer 5 is not provided. The n$^+$-type contact layer 3 is formed as a layer with a high impurity concentration of approximately $5 \times 10^{18}$ cm$^{-3}$, for example. In the case the first etch stop layer 4 is provided, it is formed to have an impurity concentration which is approximately the same as those of the previous/subsequent layers of such as the n$^+$-type contact layer 3 and n$^+$-type semiconductor layer 5. The n$^+$-type semiconductor layer 5 may be formed to have the same impurity concentration as that of the n$^+$-type contact layer 3 or may have a different impurity concentration. By providing the n$^+$-type semiconductor layer 5, the pressure resistance of the protecting element 23 may be increased. In the example shown in FIG. 2(a) to FIG. 2(e), the undoped layer 6 is provided on the n$^+$-type semiconductor layer 5. The undoped layer 6 may not be provided. However, the reverse pressures of p-n junction of the protecting element 23 and the p-channel FET 22 can be increased by providing the undoped layer 6, and it is preferable since the operating voltage of the transistor can be increased. Furthermore, the junction capacity can be decreased by inserting the undoped layer 6. Therefore, the gate capacity (junction capacity) $C_{GS}$ of the p-channel FET 22 can be decreased and the high-frequency characteristic can be improved.

In this example, the p-channel junction FET 22 performs the enhanced operation (enhancement; E mode) such that the p-type channel layer 7 is formed to have an impurity concentration and a thickness at which the p-channel closes when the gate voltage is 0. The p-type channel layer 7 is formed to have an impurity concentration of approximately $1\times10^{17}$ to $5\times10^{18}$ cm$^{-3}$ ($5\times10^{17}$ cm$^{-3}$, for example) and a thickness of approximately 20 to 100 nm. The p$^+$-type contact layer 9 is provided for forming an ohmic contact between a source/drain electrode 16 as described below and the p-type channel layer 7 and is formed to have a thickness of 30 nm or more by doping carbon, for example, so as to have a sufficient high concentration of approximately $1\times10^{19}$ cm$^{-3}$ or more ($3\times10^{19}$ cm$^{-3}$, for example).

Figure 2B:
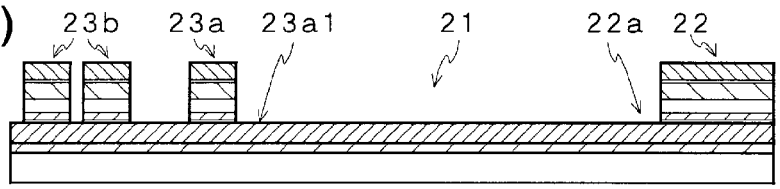
FIG. 2(b) is a sectional explanation view of steps showing one Embodiment according to the manufacturing method of the present invention.

As shown in FIG. 2(b), regions of the semiconductor circuit element forming the n-channel FET 21 are then etched by leaving regions of the p-channel FET 22 and the protecting element 23 of the semiconductor laminate portion 10 to expose the n$^+$-type contact layer 3. At this time, a portion 22a of the p-channel FET 22 region and a portion 23a of the p-n junction protecting element 23 region are also etched to expose the n$^+$-type contact layer 3 to form an electrode. In addition, a region of the a pn-np bidirectional protecting element 23b is also etched and patterned such that the two p-n junctions are separated on the n$^+$-type contact layer 3. At this time, in the case the first etch stop layer 4 is present, an etching solution is replaced after etching the semiconductor laminate portion composed of GaAs on the first etch stop layer 4 and then the first etch stop layer 4 is etched. In this way, the n$^+$-type contact layer 3 composed of GaAs can be exposed with little damage. The first etch stop layer 4 is formed to have an approximately the same impurity concentration as those of the previous/subsequent layers.

Figure 2C:
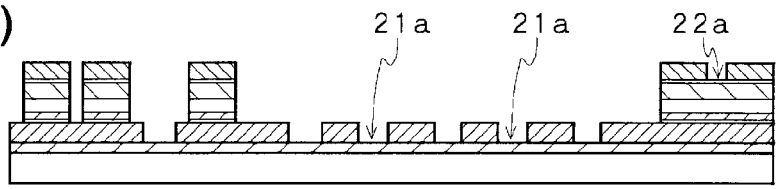
FIG. 2(c) is a sectional explanation view of steps showing one Embodiment according to the manufacturing method of the present invention.

As shown in FIG. 2(c), the n$^+$-type contact layer 3 is then patterned by leaving the n$^+$-type contact layer 3 only on both sides of the channel regions 21a in the region of the n-channel FET 21 so as to expose the n-channel layer 2 in the channel region 21a and between the respective elements. As shown in FIG. 1 and FIG. 2(a) to FIG. 2(e), there is no need to prepare a D-mode with the depletion type and an E-mode with the enhancement type. However, in the case of doing so, the impurity concentration and the thickness of the n-type channel 2 are formed to be suitable for the D-mode. For the E-mode, the n-type channel 2 is thinly etched to perform the E-mode operation. Alternatively, a different material may be used to form the gate electrode 15 as described below. Furthermore, the p$^+$-type contact layer 9 is patterned by leaving the p$^+$-type contact layer 9 only on both sides of the channel region 22a of the p-channel FET 22 in the region of the p-channel FET 22 to expose the second etch stop layer 8 or the p-type channel layer 7. In the case that the second etch stop layer 8 is present between the p-type channel layer 7 and the p$^+$-type contact layer 9, the exposed second etch stop layer 8 is etched to expose the p-type channel layer 7 in the same manner as in the p$^+$-type contact layer 9 or the second etch stop layer 8 is left as it is. The second etch stop layer 8 may be a semi-insulating layer or a p-type impurity-doped layer.

Figure 2D:
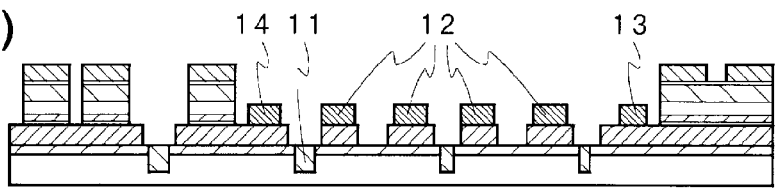
FIG. 2(d) is a sectional explanation view of steps showing one Embodiment according to the manufacturing method of the present invention.

As shown in FIG. 2(d), an isolation region 11 is then formed to electrically separate each element by implanting ions of such as oxygen or boron from the surfaces of the n-type channel layer 2 located between elements such that they reach the inside of the substrate 1. The source/drain electrodes 12 of the n-channel FET 21, the junction gate electrode 13 and one electrode 14 of the p-n junction protecting element 23a are respectively formed in the region of the n-channel FET 21, the region of the p-channel FET 22 and the region of the p-n junction protecting element 23a on the surface of the n$^+$-type contact layer 3.

Figure 2E:
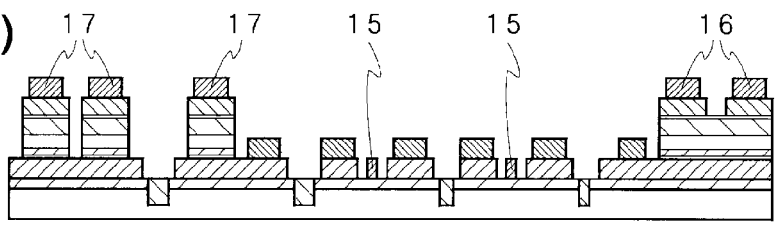
FIG. 2(e) is a sectional explanation view of steps showing one Embodiment according to the manufacturing method of the present invention.

As shown in FIG. 2(e), the gate electrodes 15 of the n-channel FET 21, the source/drain electrodes 16 of the p-channel FET 22 and the electrodes 17 for protecting element 23 are then respectively formed on the surfaces of n-type channel layer 2 between the source/drain electrodes 12 in the region of the n-channel FET 21, the surfaces of the p$^+$-type contact layer 9 in the region of the p-channel FET 22 and the surfaces of the p$^+$-type contact layer 9 of respective p-n junction protecting element 23a and pn-np bidirectional protecting element 23b. As a result, the p-n junction of the protecting element 23a is formed by the electrode 14 formed in the partially exposed region of the n$^+$-type contact layer 3 and the electrode 17 on the p$^+$-type contact layer 9. The pn-np bidirectional protecting element 23b is formed by the pair of electrodes 17 on the p$^+$-type contact layer 9 in which two semiconductor laminate portions are reversely connected via the n$^+$-type contact layer 3 and which is placed on both ends.

As described above, the semiconductor device having the complementary circuit formed by the n-channel FET 21 and p-channel FET 22 and the protecting element 23 as shown in FIG. 1 can be manufactured in the simple manufacturing process of laminating and patterning the semiconductor layer without providing selective epitaxy or selective diffusion.

Figure 3:
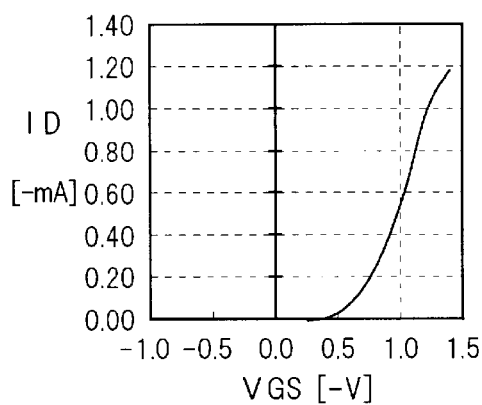
FIG. 3(a) is the I-V characteristics of the p-channel obtained by Embodiment shown in FIG. 2(a) to FIG. 2(e)
FIG. 3(b) is the I-V characteristics of the p-channel obtained by Embodiment shown in FIG. 2(a) to FIG. 2(e)
FIG. 3(c) is the I-V characteristics of the p-channel obtained by Embodiment shown in FIG. 2(a) to FIG. 2(e)
FIG. 3(d) is the I-V characteristics of the p-channel obtained by Embodiment shown in FIG. 2(a) to FIG. 2(e)
Figure 3:
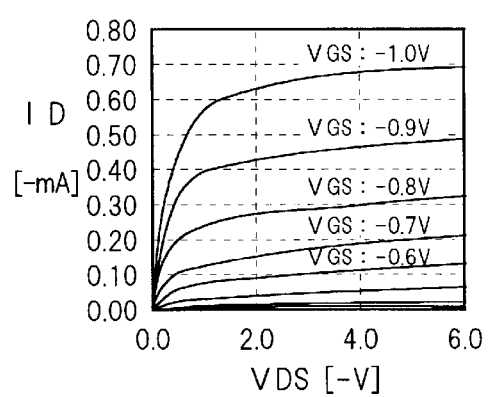
Figure 3:
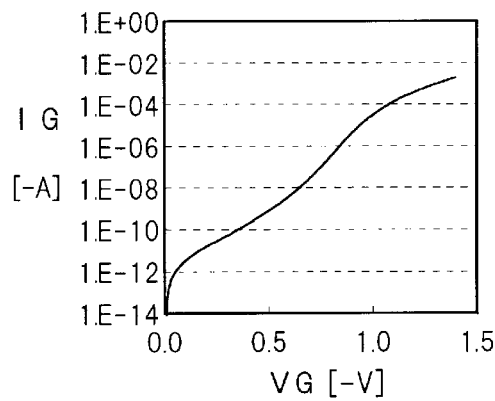
Figure 3:
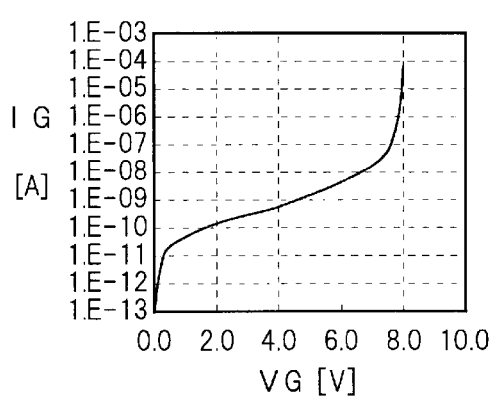
Figure 4:
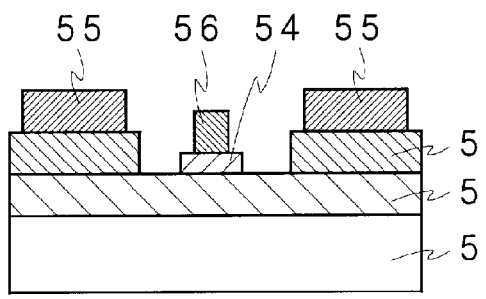
FIG. 4(a) is a sectional explanation view showing an example of a conventional junction FET.
FIG. 4(b) is a sectional explanation view showing an example of a conventional junction FET.
Figure 4:
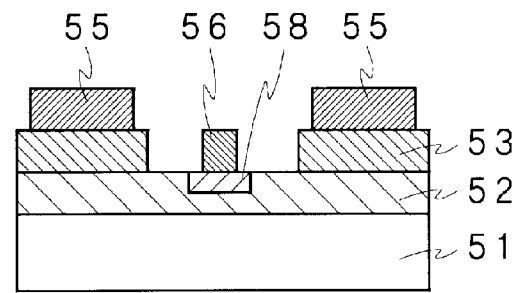

The I-V characteristics of the p-channel FET 22 (with a gate width of 100 μm) of semiconductor device manufactured according to the configuration shown in FIG. 2(a) to FIG. 2(e) is shown in FIG. 3(a) to FIG. 3(d). Due to the p-channel FET, all signs are opposite relative to the n-channel FET. FIG. 3(a) shows ID regarding VGS and it is understood that the enhanced characteristics with the pinch-off voltage of approximately −0.2 V have been obtained. FIG. 3(b) shows characteristics which represent ID change relative to VDS when VGS is changed. It shows that good saturation characteristics are obtained until VDS=6V. FIG. 3(c) shows forward characteristics of gate in which the p-n junction characteristics are present and a wide operational range with the gate forward voltage of approximately Vf=1.0V is obtained. The figure also shows the characteristics of the p-n junction protecting element 23a and both characteristics are satisfied even when the p-channel FET 22 and the protecting element 23 are manufactured by the common process. FIG. 3(d) shows reverse characteristics of the gate in which reverse breakdown voltage is approximately 8V. It is understood, with the effect of the presence of the undoped layer 6, that substantially high pressure resistance is obtained relative to reverse voltage.

As described above, a junction FET can be fabricated by the simple manufacturing process without performing selective epitaxy and selective diffusion. Therefore, a protecting element with a p-n junction can be obtained in the same manufacturing process as that of a p-channel FET. Furthermore, when an enhancement type complementary circuit is configured, the manufacturing process is significantly simple and a semiconductor device with a highly large operating voltage range can be obtained.

Though an embodiment of the present invention is described above, it is to be understood that the present invention is not limited only to the above-mentioned, various changes and modifications may be made in the invention without departing from the sprit and scope thereof.

What is claimed is:

1. A method of manufacturing a semiconductor device, said method comprising:

forming a semiconductor laminate portion by successively growing a p-type channel layer for a p-channel transistor and a p-type contact layer over an n-type contact layer provided on a substrate;

exposing the n-type contact layer by etching the semiconductor laminate portion in a region of a semiconductor circuit element while leaving the semiconductor laminate portion in a region where the p-channel transistor is formed and in a region where a protecting element is formed, wherein the semiconductor laminate portion is simultaneously etched (i) in a portion of the p-channel transistor region thereby forming an electrode, and (ii) in a portion of the protecting element region thereby forming an electrode so as to form two p-n junctions which are coupled by the n-type contact layer;

forming a gate electrode in a region where the p-channel transistor is formed thereby forming an ohmic contact with a surface of the n-type contact layer which is exposed by the etching;

forming a source/drain electrode on the p-type contact layer remaining on both sides in the channel region of the p-channel transistor region; and forming at least one electrode for the protecting element on a surface of the p-type contact layer.

2. The method of manufacturing a semiconductor device according to claim 1, wherein an etch stop layer is provided between the p-type channel layer and the p-type contact layer.

3. The method of manufacturing a semiconductor device according to claim 1, wherein an undoped layer, as a portion of the semiconductor laminate portion, is laminated between the n-type contact layer and the p-type channel layer.

4. The method of manufacturing a semiconductor device according to claim 2, wherein an undoped layer, as a portion of the semiconductor laminate portion, is laminated between the n-type contact layer and the p-type channel layer.

\* \* \* \* \*